(12) United States Patent
Chong et al.

(10) Patent No.: US 11,037,607 B2
(45) Date of Patent: Jun. 15, 2021

(54) STRONG ARM LATCH WITH WIDE COMMON MODE RANGE

(71) Applicant: Intel Corporation, Santa Clara, CA (US)

(72) Inventors: Raymond Chong, Bayan Baru (MY); Bee Min Teng, Bayan Lepas (MS); Christopher Mozak, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/220,523

(22) Filed: Dec. 14, 2018

(65) Prior Publication Data

US 2020/0194039 A1 Jun. 18, 2020

(51) Int. Cl.
| | | |
|---|---|---|
| *G01R 19/00* | (2006.01) | |
| *G11C 7/00* | (2006.01) | |
| *G11C 7/06* | (2006.01) | |
| *H03K 3/037* | (2006.01) | |
| *G11C 7/10* | (2006.01) | |
| *H04L 7/00* | (2006.01) | |
| *G11C 11/16* | (2006.01) | |
| *H04B 1/16* | (2006.01) | |
| *G11C 7/08* | (2006.01) | |

(52) U.S. Cl.
CPC .............. *G11C 7/065* (2013.01); *G11C 7/062* (2013.01); *G11C 7/08* (2013.01); *G11C 7/106* (2013.01); *G11C 7/1087* (2013.01); *G11C 11/165* (2013.01); *H03K 3/037* (2013.01); *H04B 1/16* (2013.01); *H04L 7/0037* (2013.01)

(58) Field of Classification Search
CPC ....... G11C 7/065; G11C 7/1087; G11C 7/062; G11C 11/165; G11C 7/106; G11C 7/08; H04B 1/16; H04L 7/0037; H03K 3/037
USPC .......................................................... 327/51
See application file for complete search history.

(56) References Cited

U.S. PATENT DOCUMENTS

| | | | | | |
|---|---|---|---|---|---|
| 4,121,120 | A | * | 10/1978 | Wetterling | H03K 3/023 326/93 |
| 4,568,917 | A | * | 2/1986 | McKenzie | H03M 1/74 341/118 |
| 5,245,223 | A | * | 9/1993 | Lim | H03K 3/35613 327/202 |
| 6,326,828 | B1 | * | 12/2001 | Gaiser | H03K 3/012 327/199 |
| 8,928,334 | B1 | * | 1/2015 | Raj | G01R 31/31708 324/613 |
| 9,443,567 | B1 | * | 9/2016 | Dudulwar | G11C 7/1078 |
| 9,520,891 | B1 | * | 12/2016 | Kull | H03M 1/08 |

(Continued)

*Primary Examiner* — Metasebia T Retebo
(74) *Attorney, Agent, or Firm* — Green, Howard & Mughal LLP

(57) ABSTRACT

Described is an apparatus to widen or improve a common mode range of a strong arm latch (SAL). In some embodiments, the SAL comprises a master-slave architecture with a common latch. The apparatus includes: a sampler to sample an input with a first clock, and to provide a sampled output on a node. The SAL is to receive the sampled output on the node, and to sample the sampled output according to a second clock. The apparatus comprises a digital-to-analog converter (DAC) coupled to the node, wherein the DAC is to adjust a common mode of the sampled output according to a digital control to the DAC.

26 Claims, 10 Drawing Sheets

(56) References Cited

U.S. PATENT DOCUMENTS

2018/0309408 A1\* 10/2018 Sun .................... H03F 3/45928
2019/0190529 A1\* 6/2019 Baker .................. H03M 1/002

\* cited by examiner

STRONG ARM LATCH WITH WIDE COMMON MODE RANGE

BACKGROUND

Strong Arm Latch (SAL) design (or any sense amplifier) is widely used in any system for various applications due to its value over other comparator, such as zero static power and a full rail output swing. Input common mode range is one of the key limitations of a Strong Arm Latch (SAL), particularly at a low power supply (Vcc). With an aggressive power scaling along with device scaling, the headroom of the SAL's operating region is getting narrower and narrower. Therefore, it creates two main problems: 1) the random offsets of the SAL is very large due to the non-linearity behavior of the input devices when it falls out from saturation too soon, 2) the input common mode voltage range of a SAL, $V_{cm(range)}$, is always limited within the ceiling of Vcc according to the equation below:

$$V_{cm(range)} < V_{cc} - V_{DS(stacked\ devices)} + V_{TH(input\ devices)}$$

where $V_{DS\ (stacked\ devices)}$ is the difference in source and drain voltage of the transistors in a stacked configuration in the SAL, and where $V_{TH\ (input\ devices)}$ is the threshold voltage of the transistors receiving the inputs of the SAL at their gate terminals. As such, it is challenging for any of the existing SAL technology to support common mode higher than its Vcc supply. As a result, existing SAL may not be suitable in most applications particularly at higher common mode range, despite having a lower static power consumptions compared to other comparators. Further, the use of P-SAL and N-SAL together based on common mode voltage (Vcm) create a dead zone, particularly at lower Vcc supply, that neither P-SAL nor N-SAL can operate at. These limitations make SAL usage very challenging in some applications, where continuous analog signal sampling is desired. As such, there exists a trade off with regards to the overall power of a system, speed and increasing the overall complexity of a system.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
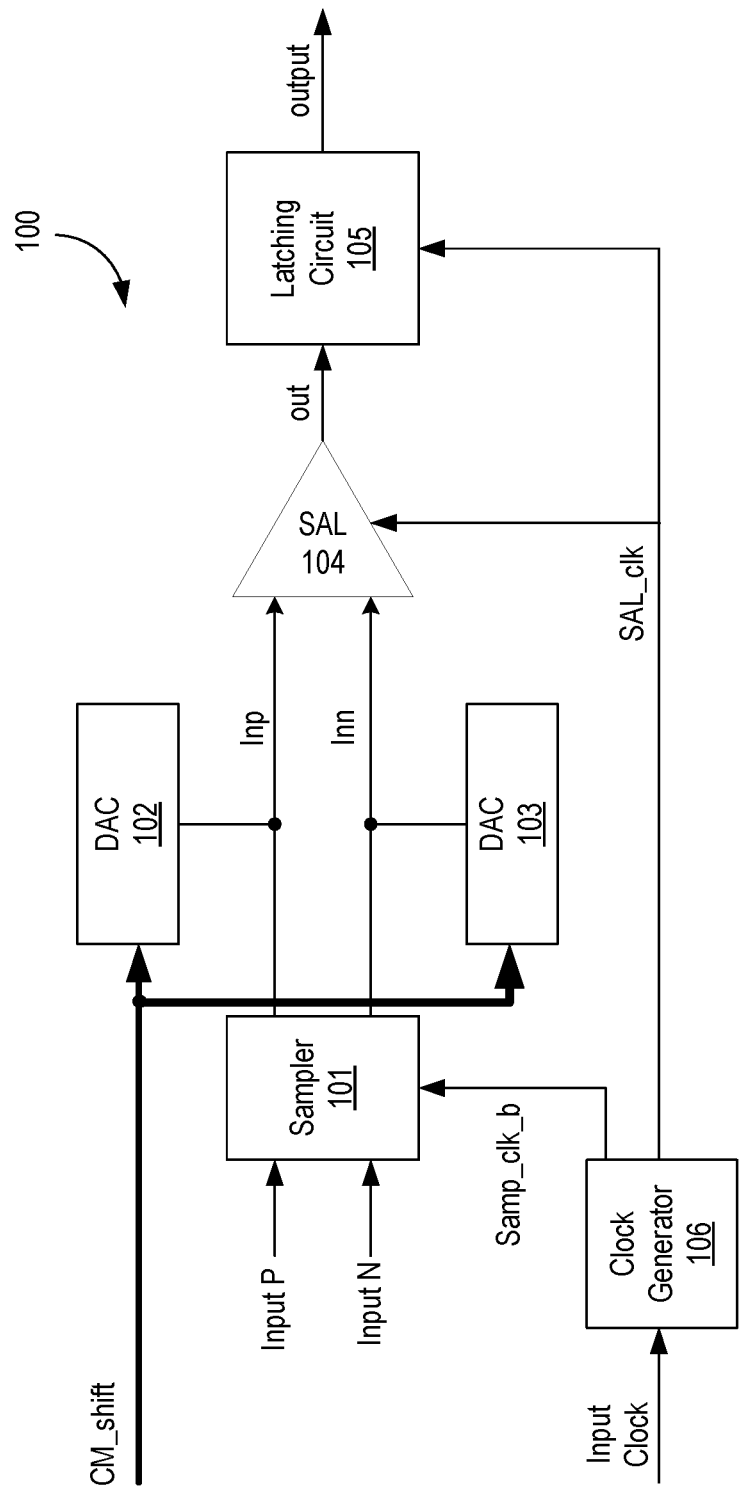
FIG. 1 illustrates a high level apparatus comprising strong arm latch (SAL) with wide common mode range, in accordance with some embodiments.

Some systems use both P-SAL and N-SAL with additional control logics to select between them based on Vcm requirements, but usages are limited to low Vcm range. Some design uses complementary differential input stage to boost up its input common mode range, but it needs feedback circuitry and decision circuitry to cut off from its differential input stage to reduce resolving contention in order to improve meta-stability, delay and power efficiency. These designs are complex and require control mechanisms to keep the circuit to operate in stable conditions. Some system uses different design, such as folded cascode amplifier, differential amplifier and other op-amp design. Such amplifiers are high power amplifiers that require careful compensation designs to achieve stability over a frequency range.

Turning on P-SAL or N-SAL with control registers or logics based on Vcm is not efficient. Continuous analog signal sampling applications, such as high resolution analog-to-digital converter (ADC) fails to operate where dead zone occurs. The design with P-SAL or N-SAL burns more power as more gate logics are needed. Complementary differential input stage with feedback and decision circuit is not efficient as it burns more power due to additional circuitry needed for proper function. Furthermore, these circuitries are connected on critical nodes of a sense amplifier, which is vulnerable to variations and increases RC loading on the nodes. As a result, complementary differential input stage with feedback and decision circuit fails to work at high frequency applications (e.g., above 2 GHz). Random offset and systematic offset may also increase drastically due to the device variations within the circuit. The feedback and decision circuitry are not instantaneous, which may not solve its contention problems.

Classical SAL, op-amp or any amplifier has headroom problems as they are having substantially more stacking than this invention. Therefore, conventional complementary topology may not work at low Vcc (e.g., as low as 0.75V) which causes a significant amount of dead zone, typically around 100 mV to 150 mV, for example. Further, any folded cascode design in a classical receiver uses analog biases that need to be distributed in coaxially shielded routing to prevent any noise coupling into the respective folded cascode receivers. Hence, a folded cascode design requires more complex physical design and layout floor planning. Also, op-amp and folded cascode amplifiers are power hungry, thus consuming significant power than a classical SAL.

Some embodiments describe an apparatus that allows for a SAL to support common mode higher than its power supply Vcc while providing lower static power consumption than traditional SAL. In some embodiments, the apparatus comprises circuitry to sample and shift down an input common mode by a same voltage difference ΔV in every evaluation cycles of the SAL, such that the input differential stage of the SAL operates in a saturation region (e.g., $V_{DS}>V_{GS}-V_{TH}$). This sample and shift process uses a racing timing on every rising and falling edges of the pulses to ensure flawless operations.

The apparatus undergoes four phases: reset phase, sampling phase, common mode shift phase, and evaluation phase. During the reset phase, the internal nodes of the SAL receiver is pre-charged to a steady state, while sampling capacitors are reset to an initial state. During the sampling phase, the input common modes are sampled by a sampler and held by the sampling capacitors. During the common mode shift phase, the sampler is open and the charges held by the sampling capacitors is discharged. The amount of discharge is based on the capacitive voltage divider of the sampling capacitor. In the process of discharging, the common mode of the SAL is adjusted (e.g., shifted down or up). During the evaluation phase, a clock rises (or falls) and the SAL starts to amplify and evaluate. The output of the SAL resolves at the end of the evaluation phase and the four phases repeat again. In some embodiments, the four phases are completed within one clock cycle, with a racing timing on every rising and falling edges of the pulses, generated by a waveform shaper circuits to ensure flawless operations.

Some embodiments describe a master-slave SAL to improve headroom drastically and work well at low Vcc (e.g., as low as 0.75 C) while keeping its power consumption minimal. In some embodiments, the master-slave SAL comprises a differential input stage that complement one another concurrently, with three conditions: 1) Master input stage is on when Slave input stage is weak and incapable, 2) Slave input stage is on when Master input stage is weak and incapable and 3) Master and Slave input stages are on while both are weak. In some embodiments, the amount of device stacking in the master-slave SAL is kept low to significantly improve headroom at low Vcc without trading off any of the key benefits of a SAL. In some embodiments, the regenerative circuit and latches are consolidated into one for both master and slave differential input stages to save power and to reduce any device variations in the circuit.

There are many technical effects of various embodiments. For example, the SAL architecture of various embodiments have zero (or near zero) static power and a full rail output swing, making it an ideal sampler for Analog to Digital Converter (ADC) applications and Feedback Loop Regulation Sensors for power supplies or any data acquisition applications. The architecture of various embodiments allows for SAL comparators to be used under nominal supply or lower Vcc power domain with higher common mode range, resulting a significant power savings. For example, architecture of various embodiments can sample and detect differential inputs at 900 mV, while it is operating under supply at 0.765 V. As a result, common mode range is no longer a limiter of the SAL and it can be used in more applications, such as voltage regulators, ADC and other comparator applications. Also, with a proper timing control of these 4 phases and by using a two stages SAL, kickback noise is tremendously reduced with greater improvements (e.g., greater than 50% improvements) during SAL evaluation phase and hence achieving a better performance compared to traditional SAL circuit topology.

In some embodiments, the master-slave SAL topology creates more opportunity for the SAL to be used in any applications, due to its power efficiency compared to other comparator topologies (e.g., more than 200% improvement in power efficiency is observed with the master-slave SAL). A rail-rail input common mode range provided by the master-slave SAL topology without any dead zone at low Vcc (e.g., as low as 0.75V) is very useful in high resolution a ADC, where continuous analog sampling is vital in those applications. The master-slave SAL topology can replace other power hungry and slower comparators in ADC applications. In some embodiments, a data receiver (RX) may adopt the master-slave SAL topology without creating two versions of P-SAL and N-SAL to meet the required common mode range, which burns more power and increases the complexity of the RX architecture and control logics. In some applications, the master-slave SAL topology can be used as duty cycle distortion (DCD) sampler at high speed data rate for full swing or low swing data. Other technical effects will be evident from various embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, mechanical, or magnetic connection between the things that are connected, without any intermediary devices. The term "coupled" means either a direct electrical, mechanical, or magnetic connection between the things that are connected or an indirect connection through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−20% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits, modules, and logic blocks are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bipolar junction transistors—BJT PNP/NPN, BiCMOS, CMOS, eFET, etc., may be used without departing from the scope of the disclosure.

FIG. 1 illustrates a high level apparatus 100 comprising strong arm latch (SAL) with wide common mode range, in accordance with some embodiments. Apparatus 100 comprises sampler 101, digital-to-analog converters (DACs) 102 and 103, SAL 104 with comparator/amplifier and latch, latch circuit 105, and clock generator 106. The sampler receives a differential input Input P and Input N, which are sampled by Samp_clk_b generated by Clock Generator 106. The clock generator 106 receives an Input Clock and uses that to generate Samp_clk_b and SAL_clk. In some embodiments, the input clock is generated by a clock source such as a phase locked loop (PLL). The sampled output are Inp and Inn which are received by input by SAL 104. In some embodiments, input common mode (CM) range is adjusted by DACs 102 and 103. For example, the CM range can be increased or decreased using CM_shift, which can be a single bit signal or a multi-bit signal (or code). The output "out" of SAL 104 can be a single-ended output or a differential output. SAL_clk is used by SAL 104 to capture and hold (e.g., latch) the evaluated result as "out". The output "out" is then latched by SAL_clk from Clock Generator 106 to generate the output for downstream processing.

Figure 2A:
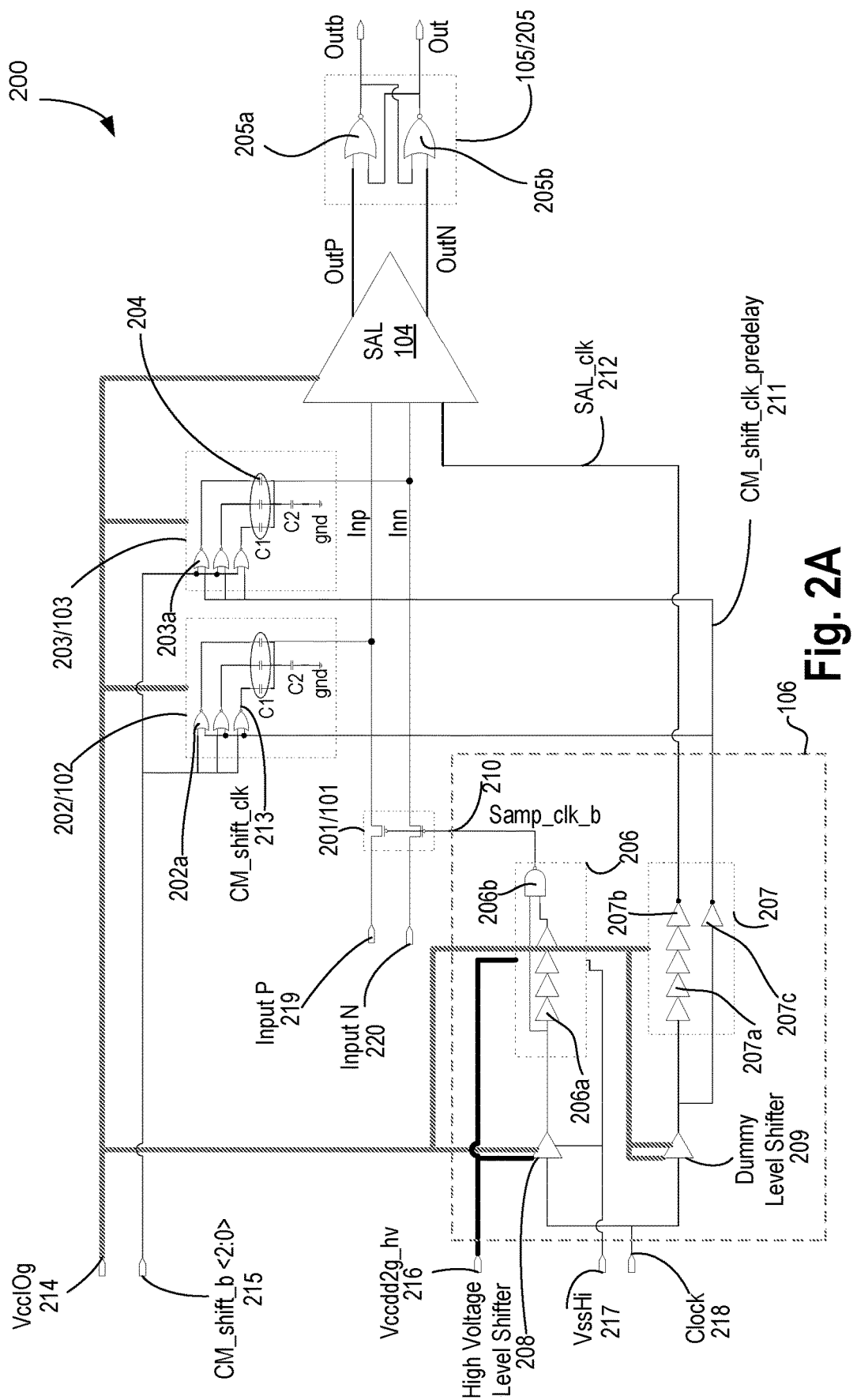
FIG. 2A illustrates a schematic of the apparatus of FIG. 1 operable to shift down the common mode range, in accordance with some embodiments.

FIG. 2A illustrates a schematic 200 of the apparatus of FIG. 1 operable to shift down the common mode range, in accordance with some embodiments. In some embodiments, sampling circuitry 201/101 can be a CMOS or PMOS pass-gates that are turned on during a sampling phase and opened for the rest of the time. In some embodiments, sampling circuitry 201/101 removes unnecessary kickback noise during SAL's evaluation and common mode shifts that introduces significant $$\frac{di}{dt}$$

on the sampling paths. Throughout the sampling phase (when sampler is closed), the differential inputs (Input P 219 and Input N 220) of the circuitry 201/101 are sampled with a pair of sampling capacitors of DAC 202/102, DAC 203/103.

In some embodiments, DAC 202/102, DAC 203/103 are two identical sub-modules coupled to the two differential inputs Inp and Inn of the SAL receiver 104. In some embodiments, during a sampling phase, the input levels of Input P 219 and Input N 220 are sampled and charges are stored in the sampling capacitors C1 204 and C2 of DAC 202/102, DAC 203/103. During sampling phase, the input levels are sampled and charges are stored in the sampling capacitors. During common mode shifts, the stored charges on capacitors C1 and C2 are discharged to a steady state value based on the capacitances of capacitors, C1 and C2. In various embodiments, the sampling capacitors, C1 and C2 of DAC 202/102, DAC 203/103 forms a capacitive voltage divider that can be either a fix value or a binary weighted and configurable capacitive legs, such that the shifted down depends on the ratio between C1 and C2.

In some embodiments, DAC 202/102 comprises NOR gates 202a that couple to capacitors C1 and C2, wherein the capacitors forms a voltage divider. The NOR gates 202a receive the various bits of CM_shift 215 (e.g., the three bits of CM_shift_b<2:0> 215) and clock CM_shift_clk_predelay 211. In some embodiments, DAC 203/103 comprises NOR gates 203a that couple to capacitors C1 and C2, wherein the capacitors forms a voltage divider. The NOR gates 203a receive the various bits of CM_shift (e.g., the three bits of CM_shift_b<2:0>) and clock CM_shift_clk_predelay 211. Depending on the logic levels of CM_shift and CM_shift_clk_predelay 211, output CM_shift_clk 213 is generated and certain number of capacitors C1 204 are coupled to capacitor C2. The ratio of capacitors C1 over the total capacitance determines the amount of shift in the common mode.

Figure 4:
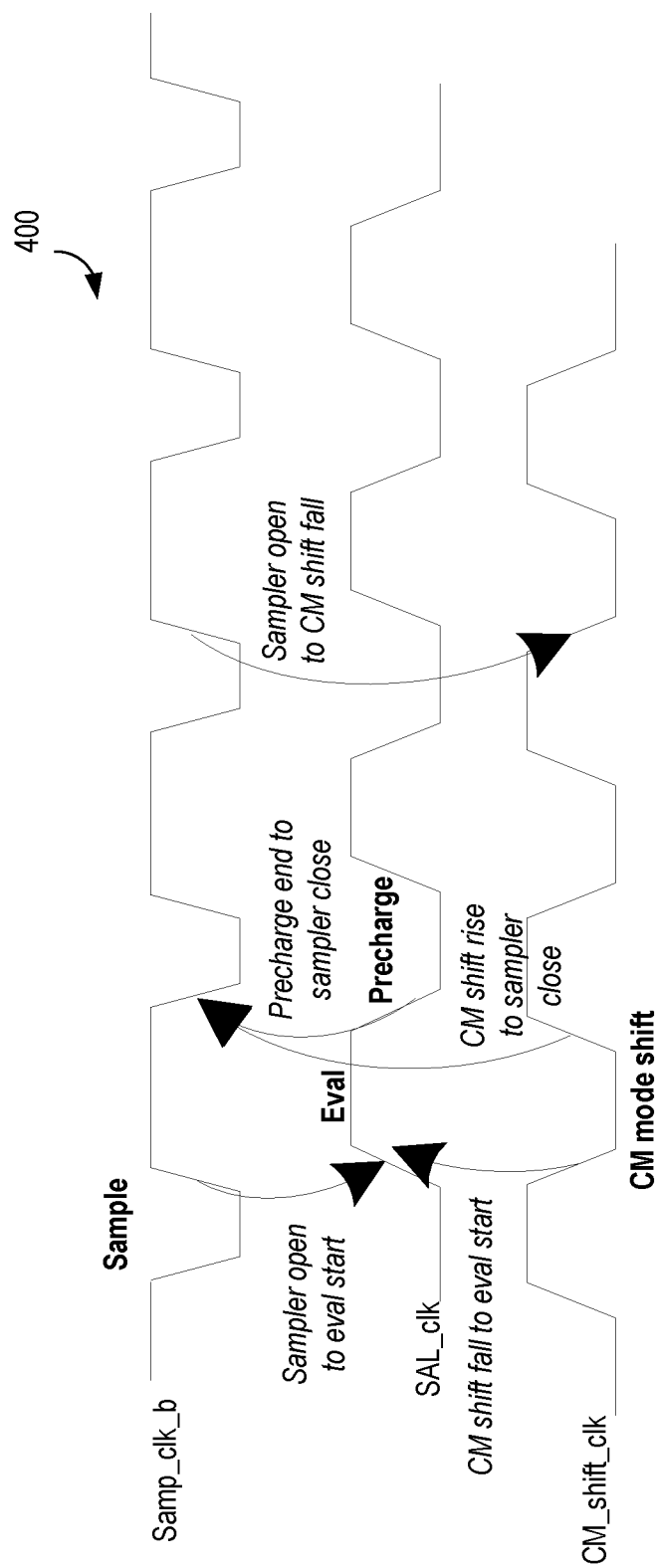
FIG. 4 illustrates a timing diagram showing non-overlapping racing condition for apparatus of FIG. 2A, in accordance with some embodiments.

In some embodiments, clock generator 106 comprises a waveform shaping circuitry 206 and 207, which creates pulses that meet the timing illustrated in FIG. 4. Referring back to FIG. 2, waveform shaping circuitry 206 comprises a delay path (e.g., an electrical path formed of buffers 206a coupled in series to provides a delayed version of the input), and a NAND gate 206b. The NAND gate 206b receives the input and the delayed version of the input to generate a pulse Samp_clk_b 210 for sampling the input signals Input P 219 and Input N 220 by samplers 201/101.

In this example, waveform shaping circuitry 206 is a high voltage path that generates a narrower high voltage (HV) pulses that toggles between HV (e.g., Vccdd2g_hv 216) and VssHi of VssHi power rail 217 for the sampler 201/101 from level shifted clock signal through a high voltage level shifter 208. Here, VssHi is an elevated ground rail (e.g., around 150-250 mV) to ensure electrical overstress (EOS) is protected. The sampler 201/101 uses the high voltage sampling signals to effectively sample higher common modes, in accordance with some embodiments. In some embodiments, the sampler pulse width is a fraction of the pulse width of Clock 218. For example, the pulse width of Samp_clk_b is ⅓ of the clock pulse width of Clock 218 to avoid pulse width evaporation upon any on die variations or aging effects.

In some embodiments, waveform shaping circuitry 207 comprises a delay path that mimics the delay characteristics of the delay path of waveform shaping circuitry 206 including NAND 206b. For example, buffers 207a mimic the propagation delay of buffers 206a while inverter 207b mimics the propagation delay of NAND 206b. In some embodiments, the waveform shaping circuitry 206 operates on a low supply VccIOg 214 (e.g., less than 1V) and provides a normal or low voltage path. The normal or low voltage path of waveform shaping circuitry 207 generates and delays clock 218 for the SAL receiver 104 and common mode shift DAC 202/102, DAC 203/103 to meet the non-overlapping timing constraints discussed with reference to FIG. 4.

Referring back to FIG. 2A, the clocks from waveform shaping circuitry 207 are CM_shift_clk_predelay 211 and SAL_clk 212. CM_shift_clk_predelay 211 is used as the second input to the NOR gates 202a/203a of the DAC 202/102, DAC 203/103, respectively. In some embodiments, an identical dummy or replica high voltage level shifter 209 is used to match the delay caused by the level shifter 208 in the high voltage path to achieve better delay and signal characteristic matching between the high voltage and low voltage electrical paths. Here, CM_shift_clk_predelay 211 is generated by inverter 207c coupled to the output of replica or dummy level shifter 209.

The various components of apparatus 200 allow for flawless design operation where in each clock cycle of clock 218, the input common mode is sampled (e.g., sampled at 900 mV) and is shifted for evaluation by SAL 104 (e.g., shifted down to 570 mV for evaluation).

In some embodiments, the output of SAL receiver 104 is a differential output OutP and OutN which is receives as input by a set-reset (RS) latch 105/205. The SAL receiver 104 amplifies the input, evaluates them, and the resolves them to rail-to-rail differential signals OutP and OutN. The RS-Latch 105/205 comprises cross-coupled NOR gates 205a/b to capture inputs OutP and OutN as Outb and Out.

Figure 2B:
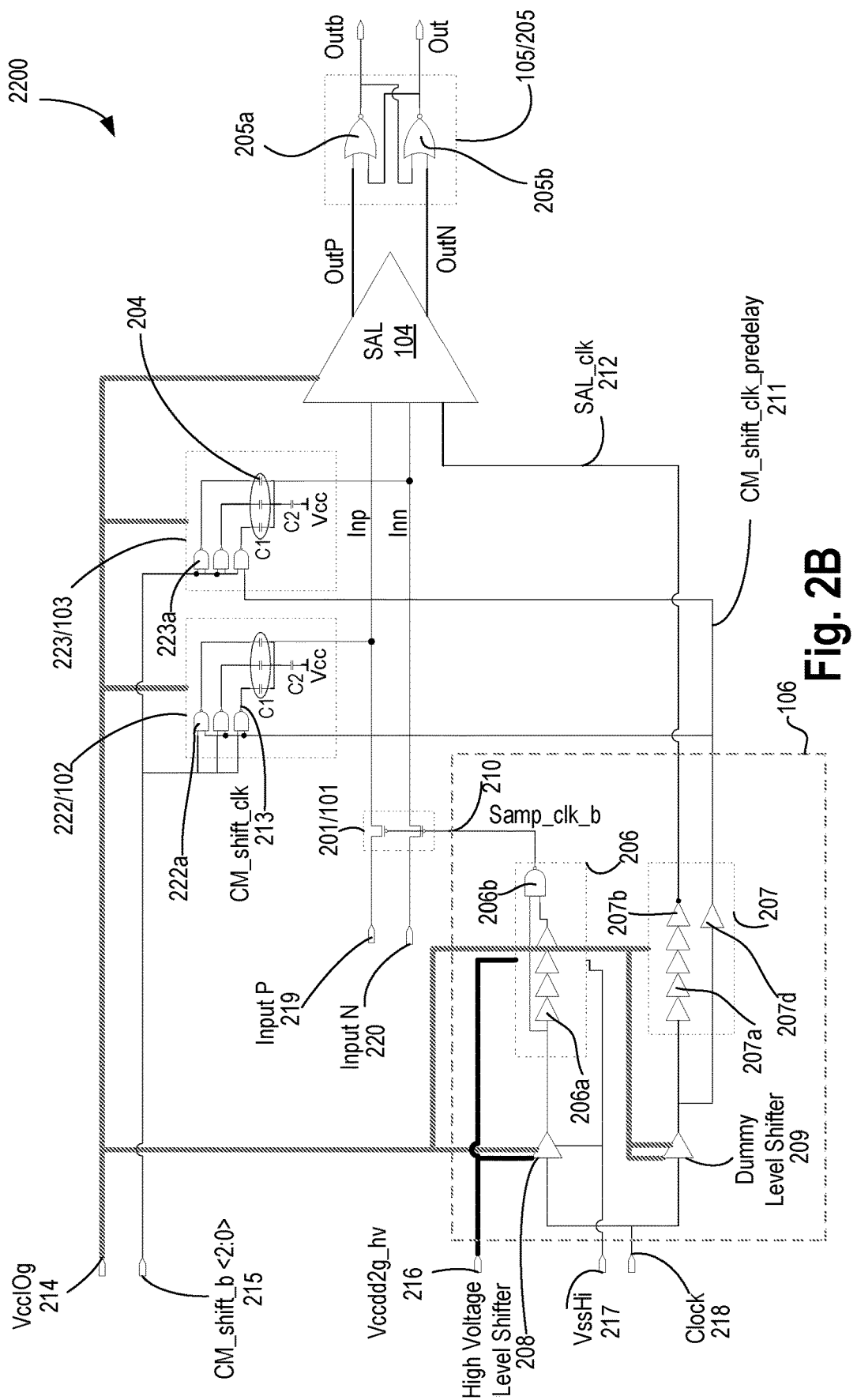
FIG. 2B illustrates a schematic of the apparatus of FIG. 1 operable to shift up the common mode range, in accordance with some embodiments.

FIG. 2B illustrates a schematic 2200 of the apparatus of FIG. 1 operable to shift up the common mode range, in accordance with some embodiments. Apparatus 2200 is similar to apparatus 200 but for shifting the common mode up rather than down. In this case, DACs 202 and 203 are replaced with DACs 222 and 223. DACs 222 and 223 are similar to DACs 202 and 203 but for replacing the NOR gates 202a and 203a with NAND gates 222a and 223a, respectively. Here, the capacitor C2 is coupled to Vcc instead of ground while inverter 207c is replaced with non-inverting buffer 207d. In FIG. 2A, when clock CM_shift_clk_predelay 211 rises, the output of the selected NOR 202a/203a falls causing the common mode on Inp/Inn to shift down. Conversely, in FIG. 2B, when clock CM_shift_clk_predelay 211 rises, the output of the selected NAND 222a/223a rises causing the common mode on Inp/Inn to shift up.

Figure 3A:
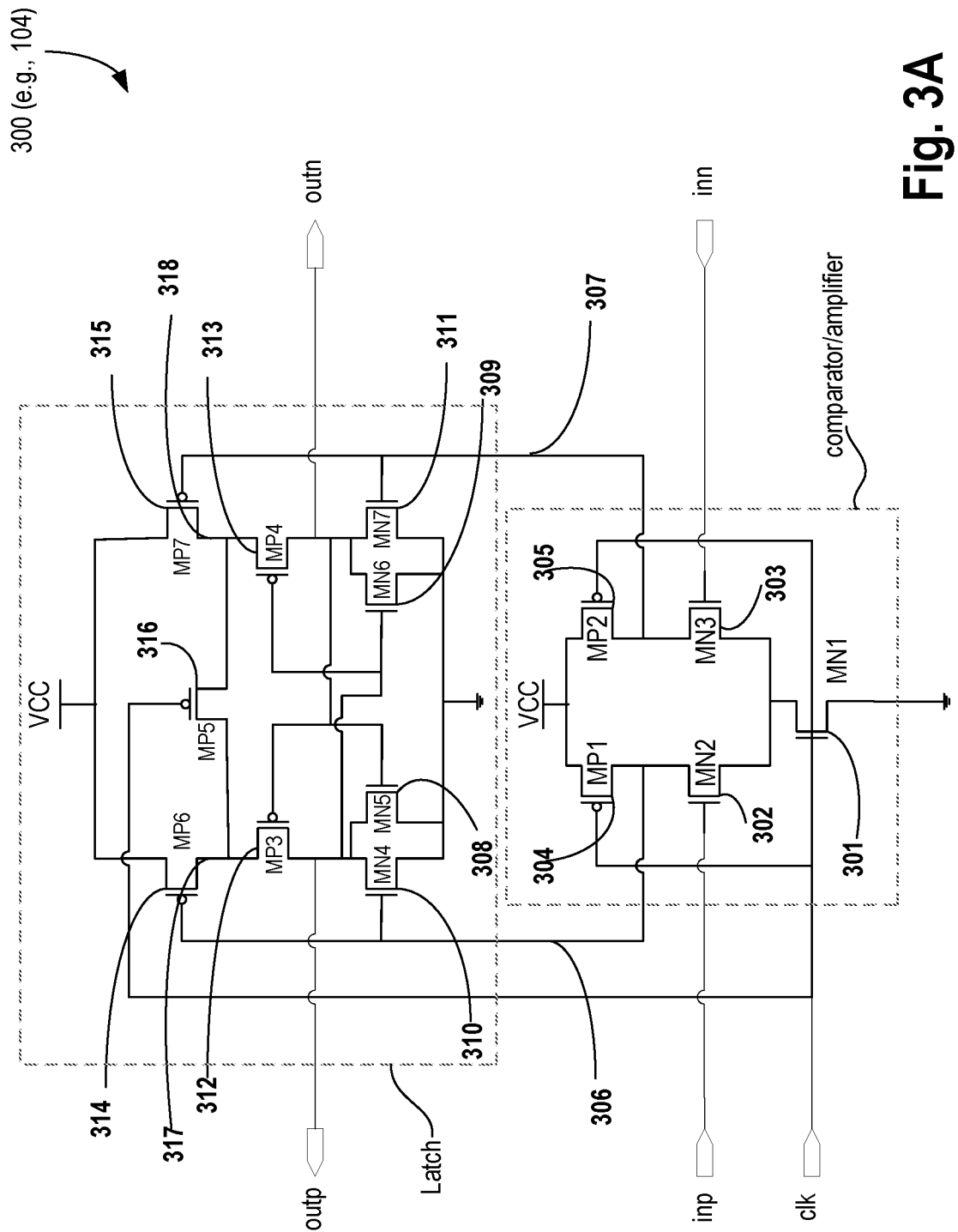
FIG. 3A illustrates a SAL with n-type input transistors, in accordance with some embodiments.

FIG. 3A illustrates a SAL 300 (e.g., SAL 104) with n-type input transistors, in accordance with some embodiments. In some embodiments, SAL 300 comprises n-type transistors MN1 (301), MN2 (302), MN3 (303), MN4 (310), MN5 (308), MN6 (309), and MN7 (311); and p-type transistors MP1 (304), MP2 (305), MP3 (312), MP4 (313), MP5 (316), MP6 (314), and MP7 (315) coupled together as shown. Transistors MN1 (301), MN2 (302), MN3 (303), MP1 (304) and MP2 (305) together forms the comparator or amplifier component of SAL 300. Transistors MN4 (310), MN5 (308), MN6 (309), MN7 (311), MP3 (312), MP4 (313), MP5 (316), MP6 (314) and MP7 (317) together form the latch component of SAL 300. The latch and the comparator components are cascaded with one another that maximizes the voltage headroom of the SAL 300, by reducing device stacking compared to classical SALs.

When clock (Clk, SAL_clk) is low, the tail device MN1 (301) and the input devices MN2 (302) and MN3 (303) are off. The internal nodes, 306 and 307 are reset and pre-charged to VCC through devices MP1 304 and MP2 305, which in turn reset the latches through MP6 314 and MP7 315. However, cutting of the latch nodes 317 and 318 from VCC leaves the nodes floating and may cause mismatches when the latch is turned back on. Therefore, an equalizer MP5 (316) is used to neutralize the mismatches between both nodes 317 and 318 when clock clk is low.

When clock is high, reset devices MP1 (304) and MP2 (305) and the equalizer device (326) are off, while the tail device MN1 (301) is on, generating a differential current flowing across differential input devices MN1 (302) and MN2 (303). The differential input is amplified and discharges the internal nodes 306 and 307 to VSS. The rate of discharge depends on the input voltages from both inputs devices MN1 (302) and MN2 (303). As the nodes discharges, the latches MP6 (314) and MP7 (315) are on. At the same time, a differential voltage is built up and passes to the back-to-back inverters MN5 (308), MN6 (309) and MP3 (312), MP4 (313), through devices MN4 (310) and MN7 (311). The back-to-back inverters MN5 (308), MN6 (309) and MP3 (312), MP4 (313) are regenerative circuits and eventually create a rail-to-rail differential output (outp and outn). The final differential output is sent to a RS latch 105 or a flop for data sampling.

Figure 3B:
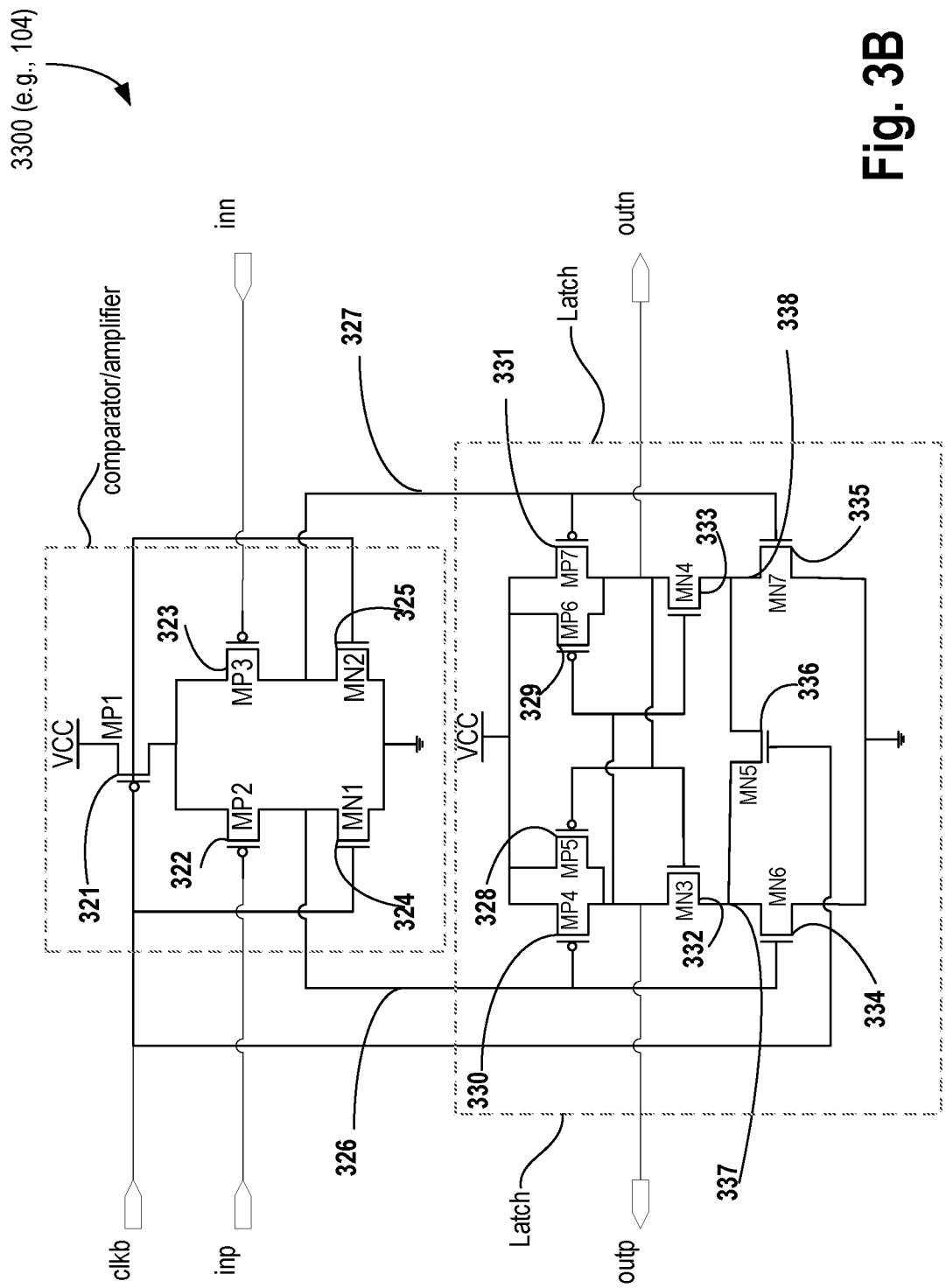
FIG. 3B illustrates a SAL with p-type input transistors, in accordance with some embodiments.

FIG. 3B illustrates SAL 3300 with p-type input transistors, in accordance with some embodiments. SAL 3300 is similar to SAL 300 but for switching the conductivity type of transistors and associated supplies. In some embodiments, SAL 3300 comprises p-type transistors MP1 (321), MP2 (322), MP3 (323), MP4 (330), MP5 (328), MP6 (329), and MP7 (331); and n-type transistors MN1 (324), MN2 (325), MN3 (332), MN4 (333), MN5 (336), MN6 (334), and MN7 (335) coupled together as shown.

Transistors MP1 (321), MP2 (322), MP3 (323), MN1 (324) and MN2 (325) together forms the comparator or amplifier component of SAL 3300. Transistors MP4 (330), MP5 (328), MP6 (329), MP7 (331), MN3 (322), MN4 (333), MN5 (336), MN6 (334) and MN7 (337) together form the latch component of SAL 3300. The latch and the comparator components are cascaded with one another that maximizes the voltage headroom of the SAL 3300, by reducing device stacking compared to classical SALs.

When clock (Clkb, SAL_clk_b, which is inverse of clk or inverse of SAL_clk) is high, the source device MP1 (321) and the input devices MP2 (322) and MP3 (323) are off. The internal nodes, 326 and 327 are reset and pre-discharged to Vss (ground) through devices MN1 324 and MN2 325, which in turn resets the latches through MN6 334 and MN7 335. However, cutting of the latch nodes 337 and 338 from Vss leaves the nodes floating 337 and 338 and may cause mismatches when the latch is turned back on. Therefore, an equalizer MN5 (336) is used to neutralize the mismatches between both nodes 337 and 338 when clock clk is high.

When clkb is low (e.g., when clk is high), reset devices MN1 (324) and MN2 (325) and the equalizer device (336) are off, while the source device MP1 (321) is on, generating a differential current flowing across differential input devices MP1 (322) and MN2 (323). The differential input is amplified and charges the internal nodes 326 and 327 to VCC. The rate of charge depends on the input voltages from both inputs devices MP1 322 and MP2 323. As the nodes charge, the latches MN6 (334) and MN7 (335) are on. At the same time, a differential voltage is built up and passes to the back-to-back inverters MP5 (328), MP6 (329) and MN3 (332), MN4 (333), through devices MP4 (330) and MP7 (331). The back-to-back inverters MP5 (328), MP6 (329) and MN3 (332), MN4 (333) are regenerative circuits and eventually create a rail-to-rail differential output (outp and outn). The final differential output is sent to a RS latch 105 or a flop for data sampling.

FIG. 4 illustrates a timing diagram 400 showing non-overlapping racing condition for apparatus of FIG. 2A, in accordance with some embodiments. The timing diagram shows the Samp_clk_b, used for sampling by samplers 101/201, SAL_clk 212, and CM_shift_clk 213. SAL_clk 212 is used by SAL 104 while CM_shift_clk 213 is used by the DACs 202/203. The process begins with sampling the inputs by sampler 101/201 and then the Pre-charge operation that precharges the capacitor(s) of DACs 202/203, and hence nodes Inp and Inn that carry the sampled signals. The common mode is then shifted by the DACs, and then the common mode shifted input signals to SAL 104 are evaluated and output is generated.

Figure 5A:
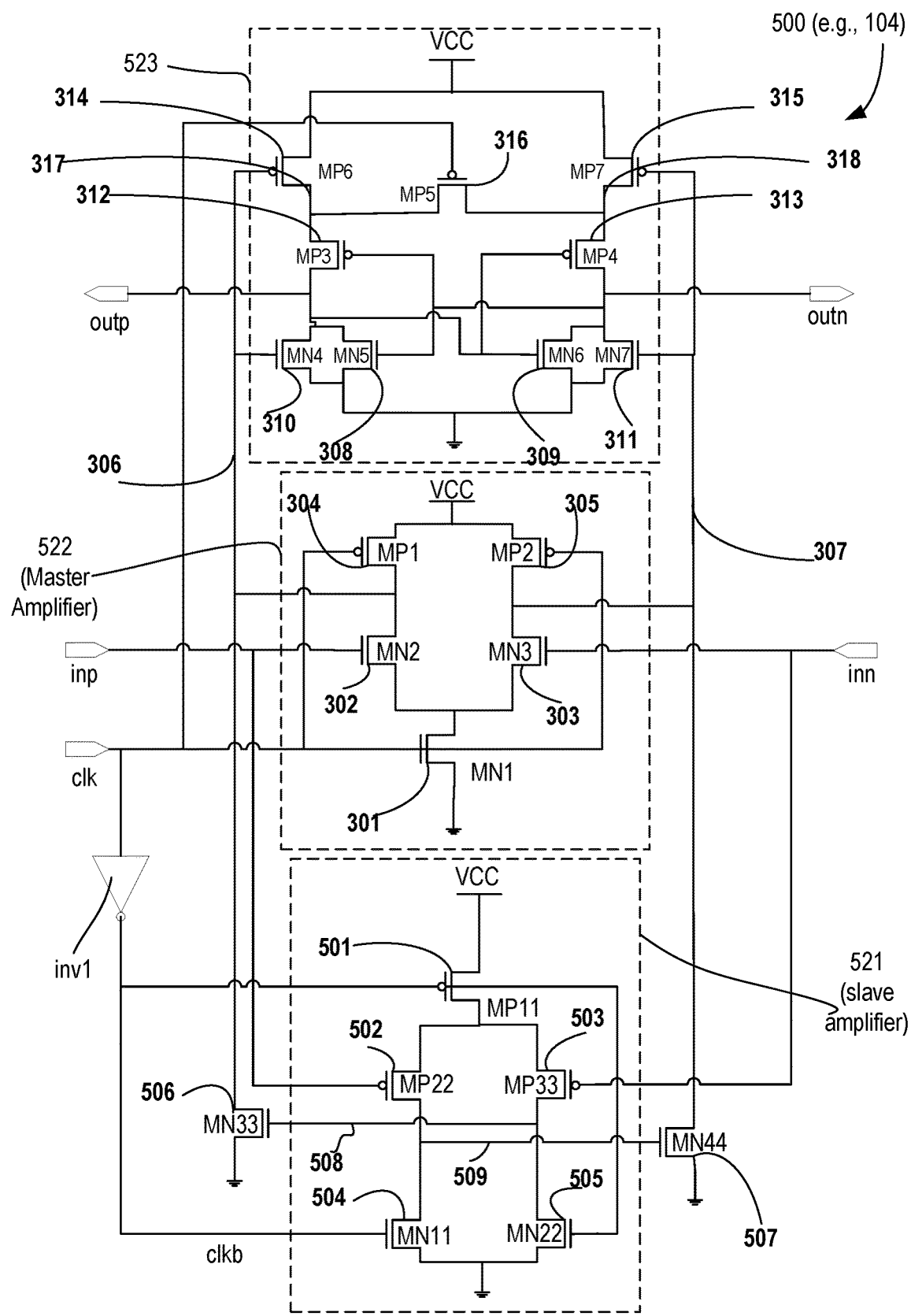
FIG. 5A illustrates a master-slave SAL, in accordance with some embodiments.

FIG. 5A illustrates a master-slave SAL 500, in accordance with some embodiments. In some embodiments, the master-slave SAL 500 comprises a slave differential amplifier (P-type) 521, a master differential amplifier (N-type) 522, and regenerative circuit 523. These three components (521, 522, 523) work concurrently to support full range rail-rail input mode at high clock frequency.

In some embodiments, slave differential amplifier (P-type) 521 comprises: p-type transistors MP11 501, MP22 502, MP33 503, and n-type transistors MN11 504 and MN22 505. Transistor MP11 501 is coupled to Vcc and is the current source of the differential circuitry 521. In some embodiments, the drain terminals of MP33 503 and MN22 505 are coupled to a gate terminal of n-type transistor MN33 506 while the drain terminals of MP22 502 and MN11 504 are coupled to a gate terminal of n-type transistor MN44 507. In some embodiments, the gate terminals of MP11 501, MN11 504, and MN22 505 are controlled by clkb, which is an inverse of clk. In some embodiments, clkb is generated by inverter inv1 that receives clk as its input. In some embodiments, the drain terminal of MN33 506 is coupled to node 306 while the drain terminal of MN44 is coupled to node 307.

Here, master differential amplifier (N-type) 522 is same as the comparator/amplifier circuitry of FIG. 3A while regenerative circuit 523 is same as the latch circuitry of FIG. 3A.

Referring back to FIG. 5A, during precharge/reset phase (when clk is low, while clkb is high), the summation nodes 306 and 307 are precharged to Vcc while disabling the regenerative circuit 523 through device latches MP6 314 and MP7 315. In the meantime, the equalizer MP5 316 is on to ensure that the regenerative circuit 523 is matched for both sides during reset. This ensure the systematic offset is kept low. Meanwhile, the slave nodes 508 and 509 are discharged to Vss.

After the reset phase, the circuit 500 enters into the amplification mode where the slave differential amplifier 521 and master differential amplifier 522 are turned on concurrently. When clk is high, the tail switch MN1 301 is on, generating a differential current through the differential pair MN2 302 and MN3 303. Depending on the differential input level (inp or inn), the higher gate voltage discharges the summation nodes 306 and 307 to ground faster. Therefore, a differential voltage, $\Delta V_{sum}$ is built up on the summation nodes 306 and 307.

Likewise, when clkb is low (e.g., when clock is high), the tail switch MP11 501 is on, generating a differential current through the differential pair MP22 502 and MP33 503. However, in this slave differential amplifier 521, the lower gate voltage on the differential inputs (inp or inn) charges up the slave nodes 508 and 509 faster. Therefore, a differential voltage, $\Delta V_{slave}$ is built up on the slave nodes 508 and 509. As $\Delta V_{slave}$ is built up, the slave nodes 508 and 509 are cross-coupled to an intermediate devices MN33 506 and MN44 507, passes and adds the $\Delta V_{slave}$ into the summation nodes 306 and 307. The novelty of this master and slave summation makes the $\Delta V_{sum}$ larger across the entire common mode range, thus removing any dead zone that may occur.

Since the master and slave amplifier 522 and 521, respectively, work concurrently, the power consumptions remains low and flat across different common modes. For example, at higher common mode, the master amplifier 522 is very strong while the slave amplifier 521 is weak and vice versa. Therefore, it does not burn additional power when both are on.

After $\Delta V_{sum}$ is built up, the circuit 500 goes into regeneration phase, where the regenerative circuit 523 is turned on through latch MP6 314 and MP7 315. The equalizer MP5 316 is off when clk is high. As $\Delta V_{sum}$ is built up through Master and Slave differential amplifier 522 and 521, respectively, during amplification phase, the $\Delta V_{sum}$ passes into the back-to-back inverters MN5 308 and MN6 309, and MP3 312 and MP4 313 through the intermediate devices MN4 310 and MN7 311 to regenerate a rail-rail differential output (outp and outn). From a large signal perspective, the summation nodes 306 and 307 are discharging to Vss at different rate between left and right side that eventually, turns off the n-type intermediate devices MN4 310 and MN7 311. Therefore, any contention that causes an increase in resolving time and meta-stability in the regenerative circuit can be avoided. Once the rail-rail differential output is created, it goes into a flop or R/S latch 105 to sample the data.

Figure 5B:
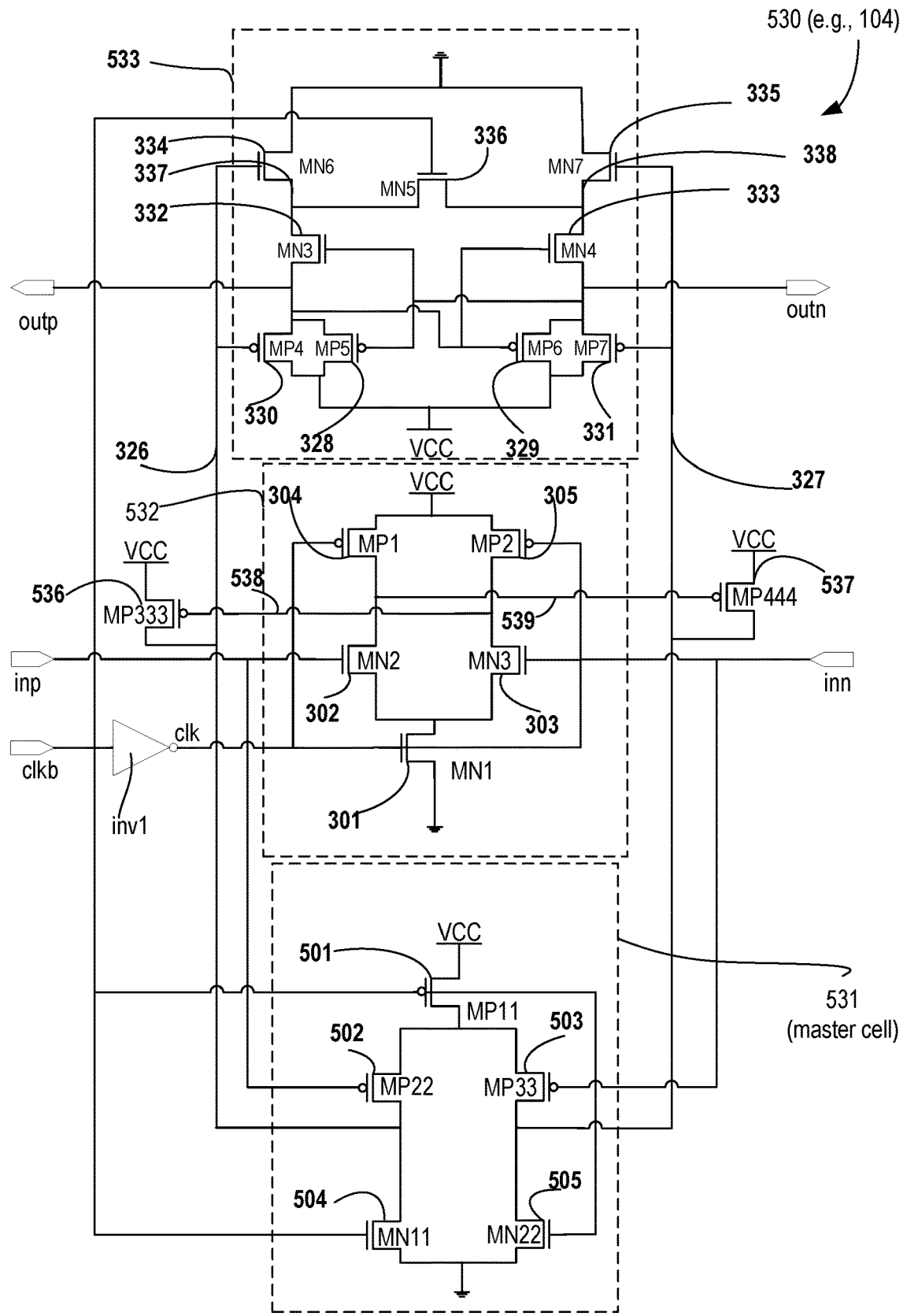
FIG. 5B illustrates a master-slave SAL, in accordance with some other embodiments.

FIG. 5B illustrates a master-slave SAL 530, in accordance with some other embodiments. SAL 530 is similar to SAL 500 but for flipping the latch 523 to latch 533 (e.g., latch of FIG. 3B). Here, circuitry 531 is the master differential amplifier while 532 is the slave differential amplifier. In SAL 530, MN1 301, MP1 304, and MP2 305 receives clk instead of clkb. Devices MN33 506 and MN44 507 of FIG. 5A are converted to p-type devices MP333 536 and MP444 537, respectively. These devices MP333 536 and MP444 537 are now coupled to the slave amplifier 532 instead of the slave amplifier 521. For example, the gate terminal of MP333 536 is coupled to node 538 while the gate terminal of MP444 537 is coupled to node 539 of master amplifier 532. Nodes 538 and 539 form the new slave nodes. The drain terminals of MP333 536 and MP444 537 are coupled to nodes 326 and 327, respectively, which are the summation nodes. The source terminals of MP333 536 and MP444 537 are coupled to Vcc. The inputs to the master amplifier 531 are also modified compared to the inputs to the master amplifier 522 of FIG. 5A. For example, the gate terminals of MP11 501, MN11 504, and MN22 505 are controlled by clkb instead of clk. Further, nodes 326 and 327 are connected to the drain terminals of MN11 504 and MN22 505, respectively. With those changes between FIG. 5A and FIG. 5B, the SAL of FIG. 5B functionally operates similar to SAL 500. A person skilled in the art would appreciate that flipping the plurality of devices and the roles of master and slave amplifiers changes the polarity of the control signals (e.g., clk and clkb) and the storage nodes, but the technical effect is the same as that of FIG. 5A.

Figure 6:
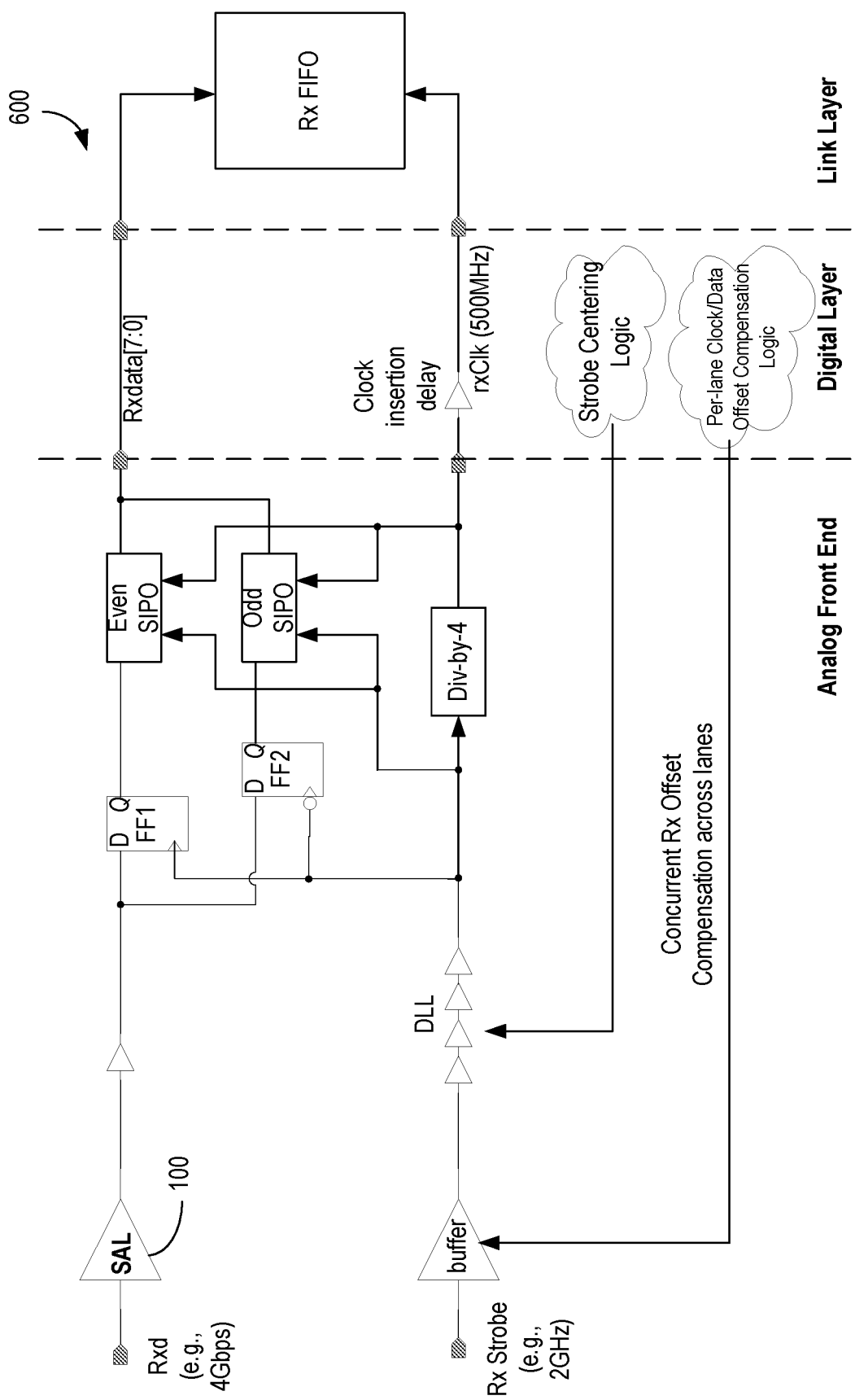
FIG. 6 illustrates a receiver having the apparatus comprising SAL with wide common mode range, according to some embodiments of the disclosure.

FIG. 6 illustrates a receiver (Rx) 600 having the apparatus comprising SAL with wide common mode range, according to some embodiments of the disclosure. In some embodiments, Rx architecture 600 comprises Analog Front End (AFE), Digital Layer, and Link Layer. In some embodiments, AFE comprises SAL architecture 100 (e.g., one of 200/2200), buffers, Delay Locked Loop (DLL), Flip-Flops (FF1, FF2), Divider (e.g., Div-by-4 which divides by four), Even Serial Input Parallel Output (SIPO), and Odd SIPO coupled together as shown. In some embodiments, SAL 100 of AFE receives Rx data (Rxd) and resolves that data. For example, SAL 100 receives data at 4 Gbps and generates latched data. In some embodiments, the buffer of AFE receives Rx Strobe (e.g., 2 GHz clock) which is readjusted by the DLL so that the Rx Strobe is centered in latched data eye.

In some embodiments, Digital Layer comprises Strobe (i.e., clock) Centering Logic, Per-lane Clock/Data Offset Compensation Logic, and Clock insertion delay. In some embodiments, Link Layer comprises Rx FIFO (First-in-First-Out) buffer. In some embodiments, Strobe Centering Logic is operable to center the Rx Strobe in the center of the data eye to capture the data with optimum margin (i.e., highest voltage margin). In some embodiments, Per-lane Clock/Data Offset Compensation Logic is used to adjust the amplifier offset associated with clock and data amplifiers for each lane. In some embodiments, Clock insertion delay is operable to add delay to the clock (e.g., by pushing its edge out in time) for meeting timing requirements.

In some embodiments, in DDR (double data rate) compliant receivers (e.g., DDR4 compliant receiver), high common mode is desired that can benefit from the SAL designs, while in low power DDR (LPDDR), lower common mode is desired which can also use the same SAL design as discussed with reference to various embodiments. The SAL design of various embodiments can also be used in high resolution and high speed ADC where rail-to-rail input common mode is desired for continuous analog sampling. The SAL design of some embodiments replaces power hungry and slower comparators in various applications.

Figure 7:
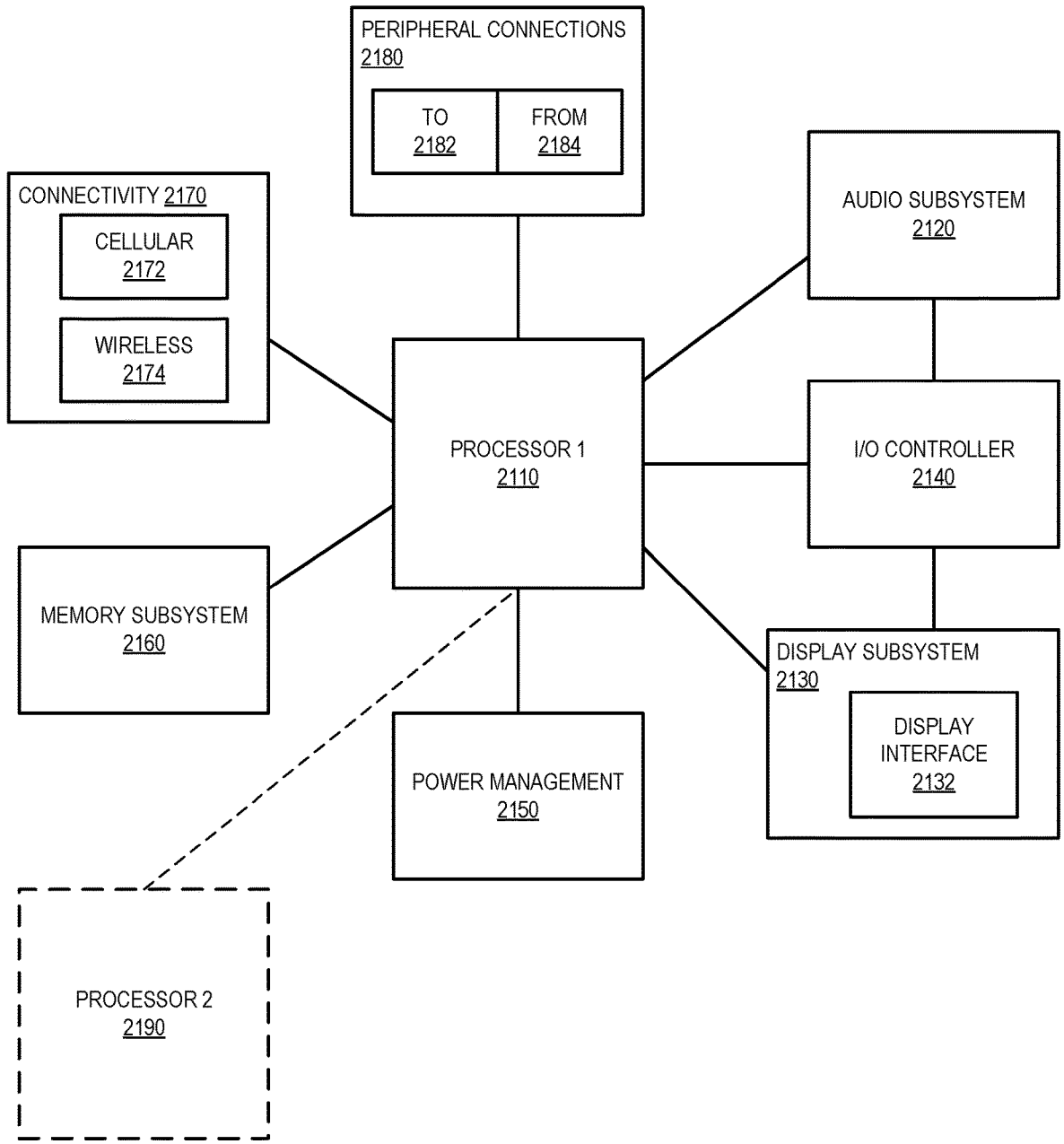
FIG. 7 illustrates a smart device or a computer system or a SoC (System-on-Chip) with apparatus comprising SAL with wide common mode range, according to some embodiments.

FIG. 7 illustrates a smart device or a computer system or a SoC (System-on-Chip) with apparatus comprising SAL with wide common mode range, according to some embodiments. FIG. 7 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 with apparatus comprising SAL with wide common mode range, according to some embodiments discussed. Other blocks of the computing device 2100 may also include the apparatus comprising SAL with wide common mode range, according to some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1

An apparatus comprising: a sampler to sample an input with a first clock, and to provide a sampled output on a node; an strong arm latch (SAL) to receive the sampled output on the node, and to sample the sampled output according to a second clock; and a digital-to-analog converter (DAC) coupled to the node, wherein the DAC is to adjust a common mode of the sampled output according to a digital control to the DAC.

Example 2

The apparatus of example 1, wherein the sampler is a first sampler, wherein the input is a first input, wherein the sampled output is a first sampled output, wherein the node is a first node, wherein the DAC is a first DAC, and wherein the apparatus comprises: a second sampler to sample a second input with the first clock, and to provide a second sampled output on a second node; and a second DAC coupled to the second node, wherein the second DAC is to adjust a common mode of the second sampled output according to the digital control to the second DAC.

Example 3

The apparatus of example 2, wherein the SAL is to receive the second sampled output on the second node, and to sample the second sampled output according to the second clock.

Example 4

The apparatus of example 2, wherein the first or second DACs comprises: a capacitive voltage divider; and a plurality of NOR or NAND cases coupled to the capacitive voltage divider, wherein the plurality of NOR or NAND is to receive a third clock and the digital control.

Example 5

The apparatus of example 1 comprises a pulse generator to generate the first clock with an input clock.

Example 6

The apparatus of example 5, wherein the sampler comprises a p-type device (or CMOS devices like a transmission gate) having a gate terminal coupled to an output of the pulse generator.

Example 7

The apparatus of example 1, wherein the digital control is a multibit control.

Example 8

The apparatus of example 2, wherein the SAL comprises: a first differential circuitry to receive the first and second sampled inputs; a second differential circuitry to receive the first and second sampled inputs; and a latch circuitry coupled to the first and second differential circuitries.

Example 9

An apparatus comprising: a strong arm latch (SAL) to receive an input; and a digital-to-analog converter (DAC) coupled to the SAL, wherein the DAC is to adjust a common mode of the input according to a digital control to the DAC.

Example 10

The apparatus of example 9, wherein the SAL comprises: a differential circuitry to receive the input; and a latch circuitry coupled to the differential circuitry.

Example 11

The apparatus of example 9, wherein the input is a first input, and wherein the apparatus comprises a sampler to sample a second input with a first clock, and to provide the first input as a sampled version of the second input.

Example 12

The apparatus of example 9, wherein the DAC comprises: a capacitive voltage divider; and a plurality of NOR or NAND cases coupled to the capacitive voltage divider, wherein the plurality of NOR or NAND is to receive a third clock and the digital control.

Example 13

The apparatus of example 11 comprises a pulse generator to generate the first clock with an input clock.

Example 14

The apparatus of example 13, wherein the sampler comprises a p-type device (or CMOS devices like a transmission gate) having a gate terminal coupled to an output of the pulse generator.

Example 15

The apparatus of example 9, wherein the digital control is a multibit control.

Example 16

A system comprising: a memory; a processor coupled to the memory, the processor having a receiver including a sense amplifier latch, wherein the sense amplifier latch comprises: a sampler to sample an input with a first clock, and to provide a sampled output on a node; an strong arm latch (SAL) to receive the sampled output on the node, and to sample the sampled output according to a second clock; and a digital-to-analog converter (DAC) coupled to the node, wherein the DAC is to adjust a common mode of the sampled output according to a digital control to the DAC; and a wireless interface to allow the processor to communicate with another device.

Example 17

The system of example 16, wherein the processor comprises a serial-input-to-parallel-output (SIPO) circuit for converting an output of the latching circuit to a parallel output.

Example 18

The system of example 16, wherein the memory is one of a Magnetic Random Access Memory (MRAM) or a Dynamic Random Access Memory (DRAM).

Example 19

The system of example 16, wherein the sampler is a first sampler, wherein the input is a first input, wherein the sampled output is a first sampled output, wherein the node is a first node, wherein the DAC is a first DAC, and wherein the apparatus comprises: a second sampler to sample a second input with the first clock, and to provide a second sampled output on a second node; and a second DAC coupled to the second node, wherein the second DAC is to adjust a common mode of the second sampled output according to the digital control to the second DAC.

Example 20

The system of example 19, wherein the SAL is to receive the second sampled output on the second node, and to sample the second sampled output according to the second clock, wherein the first or second DACs comprises: a capacitive voltage divider; and a plurality of NOR or NAND cases coupled to the capacitive voltage divider, wherein the plurality of NOR or NAND is to receive a third clock and the digital control.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first sampler to sample an input with a first clock, and to provide a sampled output on a first node;
a strong arm latch (SAL) to receive the first sampled output on the first node, and to sample the sampled output according to a second clock;
a first digital-to-analog converter (DAC) coupled to the first node, wherein the first DAC is to adjust a common mode of the first sampled output according to a digital control to the DAC, wherein the first DAC is to adjust the common mode higher than a power supply voltage for the SAL;
a second sampler to sample a second input with the first clock, and to provide a second sampled output on a second node; and
a second DAC coupled to the second node, wherein the second DAC is to adjust a common mode of the second sampled output according to the digital control to the second DAC;
wherein the SAL comprises:
a first differential circuitry to receive the first and second sampled inputs;
a second differential circuitry to receive the first and second sampled inputs; and
a latch circuitry coupled to the first and second differential circuitries.

2. The apparatus of claim 1, wherein the SAL is to receive the second sampled output on the second node, and to sample the second sampled output according to the second clock.

3. The apparatus of claim 1, wherein the first or second DACs comprises:
a capacitive voltage divider; and
a plurality of NOR or NAND gates coupled to the capacitive voltage divider, wherein the plurality of NOR or NAND gates is to receive a third clock and the digital control.

4. The apparatus of claim 1 comprises a pulse generator to generate the first clock with an input clock.

5. The apparatus of claim 4, wherein the first or second sampler comprises a p-type device having a gate terminal coupled to an output of the pulse generator.

6. The apparatus of claim 1, wherein the digital control is a multibit control.

7. An apparatus comprising:
a differential strong arm latch (SAL) to receive two sampled inputs; and
first and second digital-to-analog converters (DACs) coupled to the differential SAL, wherein the first and second DACs are to adjust common modes of the two sampled inputs according to a first and second digital controls to the first and second DACs; and
a latch coupled to an output of the differential SAL, wherein the differential SAL is to receive a first clock separate from a second clock which is used to generate the two sampled inputs.

8. The apparatus of claim 7, wherein the differential SAL comprises:
a differential circuitry to receive the two sampled inputs; and
a latch circuitry coupled to the differential circuitry.

9. The apparatus of claim 7, wherein the two sampled inputs are a first input and a second input that are generated by first and second samplers, respectively.

10. The apparatus of claim 7, wherein the first DAC comprises:
a capacitive voltage divider; and
a plurality of NOR or NAND gates coupled to the capacitive voltage divider, wherein the plurality of NOR or NAND gates is to receive a clock and the digital control.

11. The apparatus of claim 9 comprises a pulse generator to generate the second clock with an input clock, wherein at least one of the first or second samplers receive the second clock.

12. The apparatus of claim 11, wherein the first sampler comprises a p-type device having a gate terminal coupled to an output of the pulse generator.

13. The apparatus of claim 7, wherein the digital control is a multibit control.

14. The apparatus of claim 7, wherein a differential circuitry of the differential SAL comprises:
a master input stage; and
a slave input stage, wherein the master input stage is to operate when the slave input stage is incapable to operate, and wherein the slave input stage is to operate when the master stage is incapable.

15. The apparatus of claim 14, wherein each of the master input stage and the slave input stage comprises a differential amplifier.

16. The apparatus of claim 11, wherein the differential SAL, and the first and second DACs operate of a first power supply voltage from a first power supply rail, wherein the pulse generator is to operate a second power supply voltage from a second power supply rail separate from the first power supply rail.

17. The apparatus of claim 16, wherein the second power supply voltage is higher than a first power supply voltage.

18. The apparatus of claim 17, wherein pulse generator is to receive an elevated ground to cause the second clock to toggle between the second power supply voltage and the elevated ground.

19. The apparatus of claim 18, wherein the elevated ground is elevated by 150 mV to 250 mV relative to non-elevated ground of 0 V.

20. The apparatus of claim 11, wherein a pulse width of the second clock is about $\frac{1}{3}^{rd}$ of a pulse width of the input clock.

21. The apparatus of claim 7, wherein the latch comprises a set-reset latch.

22. A system comprising:
a memory;
a processor coupled to the memory, the processor having a receiver including a sense amplifier latch, wherein the sense amplifier latch comprises:
a first sampler to sample an input with a first clock, and to provide a sampled output on a first node;
a strong arm latch (SAL) to receive the first sampled output on the first node, and to sample the first sampled output according to a second clock;
a first digital-to-analog converter (DAC) coupled to the first node, wherein the first DAC is to adjust a common mode of the first sampled output according to a digital control to the DAC, wherein the first DAC is to adjust the common mode higher than a power supply voltage for the SAL;

a second sampler to sample a second input with the first clock, and to provide a second sampled output on a second node; and a second DAC coupled to the second node, wherein the second DAC is to adjust a common mode of the second sampled output according to the digital control to the second DAC;

wherein the SAL comprises:

a first differential circuitry to receive the first and second sampled inputs;

a second differential circuitry to receive the first and second sampled inputs; and a latch circuitry coupled to the first and second differential circuitries; and a wireless interface to allow the processor to communicate with another device.

23. The system of claim 22, wherein the processor comprises a serial-input-to-parallel-output (SIPO) circuit for converting an output of the latch circuitry to a parallel output.

24. The system of claim 22, wherein the memory is one of a Magnetic Random Access Memory (MRAM) or a Dynamic Random Access Memory (DRAM).

25. The system of claim 22, wherein the SAL is to receive the second sampled output on the second node, and to sample the second sampled output according to the second clock.

26. The system of claim 22, wherein the first or second DACs comprise:

a capacitive voltage divider; and a plurality of NOR or NAND gates coupled to the capacitive voltage divider, wherein the plurality of NOR or NAND gates is to receive a third clock and the digital control.

* * * * *